(12) United States Patent
Wong et al.

(10) Patent No.: US 9,706,662 B2
(45) Date of Patent: Jul. 11, 2017

(54) ADAPTIVE INTERPOSER AND ELECTRONIC APPARATUS

(71) Applicant: Raytheon Company, Waltham, MA (US)

(72) Inventors: Tse E. Wong, Los Alamitos, CA (US); Kenneth T. Teshiba, Torrance, CA (US); Shea Chen, Plano, TX (US)

(73) Assignee: RAYTHEON COMPANY, Waltham, MA (US)

( * ) Notice: Subject to any disclaimer, the term of this patent is extended or adjusted under 35 U.S.C. 154(b) by 93 days.

(21) Appl. No.: 14/755,490

(22) Filed: Jun. 30, 2015

(65) Prior Publication Data
US 2017/0006705 A1 Jan. 5, 2017

(51) Int. Cl.
| | | |
|---|---|---|
| *H05K 1/11* | (2006.01) | |
| *H05K 1/18* | (2006.01) | |
| *H01L 23/498* | (2006.01) | |
| *H05K 1/14* | (2006.01) | |
| *H05K 3/40* | (2006.01) | |
| *H01L 23/00* | (2006.01) | |
| *H05K 3/34* | (2006.01) | |

(Continued)

(52) U.S. Cl.
CPC ........... *H05K 1/181* (2013.01); *B23K 35/262* (2013.01); *B23K 35/268* (2013.01); *C22C 11/06* (2013.01); *C22C 13/00* (2013.01); *H01L 23/49827* (2013.01); *H01L 24/80* (2013.01); *H05K 1/111* (2013.01); *H05K 3/3436* (2013.01); *H05K 3/3463* (2013.01); *H05K 3/4061* (2013.01); *H05K 1/141* (2013.01); *H05K 2201/10378* (2013.01); *H05K 2201/2081* (2013.01)

(58) Field of Classification Search
CPC ....... B23K 35/268; H05K 2201/10378; H05K 1/181; H05K 1/111; H05K 3/4061; H05K 3/3436; H05K 3/3463; H05K 1/141; H01L 23/49827; H01L 24/80
See application file for complete search history.

(56) References Cited

U.S. PATENT DOCUMENTS 4,788,767 A * 12/1988 Desai .................. H01L 23/4985
228/56.3
4,887,760 A * 12/1989 Yoshino .............. H01L 21/4839
228/180.22

(Continued)

FOREIGN PATENT DOCUMENTS

JP 2004119945 A * 4/2004

OTHER PUBLICATIONS

Bussrakons, Application Note AN-1016, Hermetic Surface-Mount Discrete Semiconductor, Aug. 5, 2006, Solutions to Assembly Integration, International Rectifier.*

(Continued)

*Primary Examiner* — Nathan Milakovich
(74) *Attorney, Agent, or Firm* — Cantor Colburn LLP

(57) ABSTRACT

An adaptive interposer is provided to be operably disposable between first and second solder materials of first and second electronic devices, respectively. The adaptive interposer includes a plate element formed to define cavities and third solder material disposable in the cavities to be electrically communicative with the first and second solder materials. The third solder material is more compliant and has a higher melting temperature than at least the second solder materials.

20 Claims, 3 Drawing Sheets

(51) Int. Cl.
*B23K 35/26* (2006.01)
*C22C 11/06* (2006.01)
*C22C 13/00* (2006.01)

(56) References Cited

U.S. PATENT DOCUMENTS

| | | | |
|---|---|---|---|
| 5,135,606 A * | 8/1992 | Kato | H01L 21/486 |
| | | | 205/135 |
| 5,139,972 A * | 8/1992 | Neugebauer | H01L 21/50 |
| | | | 257/E21.499 |
| 5,188,985 A | 2/1993 | Medeiros | |
| 5,299,730 A * | 4/1994 | Pasch | G03F 7/70433 |
| | | | 228/180.22 |
| 5,551,627 A * | 9/1996 | Leicht | B23K 35/001 |
| | | | 228/180.22 |
| 5,785,799 A | 7/1998 | Culnane | |
| 5,821,617 A * | 10/1998 | Autry | H01L 23/15 |
| | | | 257/701 |
| 5,859,407 A * | 1/1999 | Saiki | B23K 20/004 |
| | | | 219/209 |
| 5,879,530 A | 3/1999 | Caillat | |
| 5,924,622 A * | 7/1999 | Davis | B23K 3/0623 |
| | | | 156/236 |
| D423,532 S | 4/2000 | Yamasaki | |
| 6,080,936 A | 6/2000 | Yamasaki et al. | |
| 6,153,940 A | 11/2000 | Zakel | |
| 6,258,627 B1 * | 7/2001 | Benenati | H01L 21/563 |
| | | | 257/E21.503 |
| 6,276,593 B1 | 8/2001 | Artaki | |
| 6,285,067 B1 * | 9/2001 | Hyoudo | H01L 23/10 |
| | | | 257/529 |
| 6,285,083 B1 * | 9/2001 | Imai | H01L 23/3114 |
| | | | 257/772 |
| 6,362,437 B1 | 3/2002 | Arai | |
| 6,518,677 B1 * | 2/2003 | Capote | B23K 35/025 |
| | | | 257/778 |
| 6,774,315 B1 | 8/2004 | Pierson | |
| 7,208,834 B2 | 4/2007 | Lee | |
| 7,245,022 B2 | 7/2007 | Farooq | |
| 7,348,215 B2 * | 3/2008 | Lee | H01L 23/13 |
| | | | 257/E21.509 |
| 7,833,897 B2 | 11/2010 | Knickerbocker | |
| 7,892,441 B2 | 2/2011 | Pai | |
| 7,948,758 B2 | 5/2011 | Buhler | |
| 8,062,968 B1 * | 11/2011 | Conn | H01L 23/055 |
| | | | 257/779 |
| 8,125,081 B2 | 2/2012 | Ohta | |
| 8,143,717 B2 * | 3/2012 | Medeiros, III | H01L 23/055 |
| | | | 257/710 |
| 8,450,825 B2 * | 5/2013 | Limaye | H01L 23/13 |
| | | | 257/467 |
| 9,392,713 B2 * | 7/2016 | Au | H01L 23/055 |
| 2009/0033337 A1 | 2/2009 | Pasco | |
| 2009/0184155 A1 | 7/2009 | Kim | |
| 2010/0314072 A1 | 12/2010 | Lee | |
| 2011/0180317 A1 * | 7/2011 | Takahashi | H01L 23/147 |
| | | | 174/537 |
| 2011/0240357 A1 * | 10/2011 | Kariya | H01L 23/5389 |
| | | | 174/266 |
| 2013/0200511 A1 * | 8/2013 | Banijamali | H01L 25/0652 |
| | | | 257/737 |

OTHER PUBLICATIONS

Semelab Plc, SMD05 Semelab Aerospace Package Dimensions, Aug. 2002, Version 1.01.*
ISR/WO, Issued Jul. 13, 2016, PCT Application No. PCT/US16/029656.

* cited by examiner

ADAPTIVE INTERPOSER AND ELECTRONIC APPARATUS

BACKGROUND

The present invention relates to an adaptive interposer and, more specifically, to an adaptive interposer for operable disposition between first and second electronic devices.

A surface mount ceramic device (i.e., an SMD.5 or, more generally, an SMD) typically includes an alumina substrate with a Kovar™ housing and lid and three terminal pads, which are configured to be soldered onto a printed wiring board (PWB). However, since the PWB and the SMD often have different coefficients of thermal expansion (CTE), the PWB and the SMD frequently expand and contract at different rates during thermal cycling. This often leads to cracking in one or both of the PWB and the SMD.

Indeed, it has been seen that substrate cracking of the alumina substrate due to SMD and PWB CTE mismatches can be experienced by the SMD. Such cracking can occur during thermal cycling for SMD.5 assembly processes, in-service environments and user-related environmental exposures in which the SMD and the PWB are both exposed to temperatures ranging from about −55° C. to about 125° C.

Previous attempts to address the problem of substrate cracking in SMD.5 thermal cycling or other similar environments have involved the use of an SMD carrier. The SMD carrier is a leaded ceramic substrate with extended flat copper leads and is sandwiched between the SMD and the PWB to reduce the CTE mismatch and to thereby decrease induced loading. The footprint of the SMD carrier is often relatively large, however, as compared to the SMD device itself, which leads to an efficient use of space on the PWB. Other techniques have made use of a constrained-core PWB having a lower CTE or/and a heat sink attached onto the PWB. However, both of these other techniques tend to increase costs and delivery schedules and may not be applicable for larger sized SMD devices.

SUMMARY

According to one embodiment of the present invention, an adaptive interposer is provided to be operably disposable between first and second solder materials of first and second electronic devices, respectively. The adaptive interposer includes a plate element formed to define cavities and third solder material disposable in the cavities to be electrically communicative with the first and second solder materials. The third solder material is more compliant and has a higher melting temperature than at least the second solder materials.

According to another embodiment of the present invention, an adaptive interposer assembly is operably disposable between first and second electronic devices. The adaptive interposer assembly includes first and second solder materials disposable proximate to terminal pads of the first and second electronic devices, respectively, a plate element formed to define cavities configured to correspond in position to respective locations of the terminal pads of the first and second electronic devices and third solder material disposable in the cavities between the first and second solder material to be electrically communicative with the first and second solder materials. The third solder material is more compliant and has a higher melting temperature than at least the second solder materials.

According to another embodiment of the present invention, an electronic apparatus is provided and includes a first electronic device comprising first terminal pads, a second electronic device comprising second terminal pads, first and second solder materials disposable proximate to the first and second terminal pads, respectively, at least one plate element and third solder material. The at least one plate element is formed to define at least one cavity configured to correspond in position to a respective location of a corresponding one of each of the first and second terminal pads. The third solder material is disposable in each cavity between the first and second solder materials to be electrically communicative with the first and second solder materials and is more compliant and has a higher melting temperature than at least the second solder materials.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

Figure 1A:
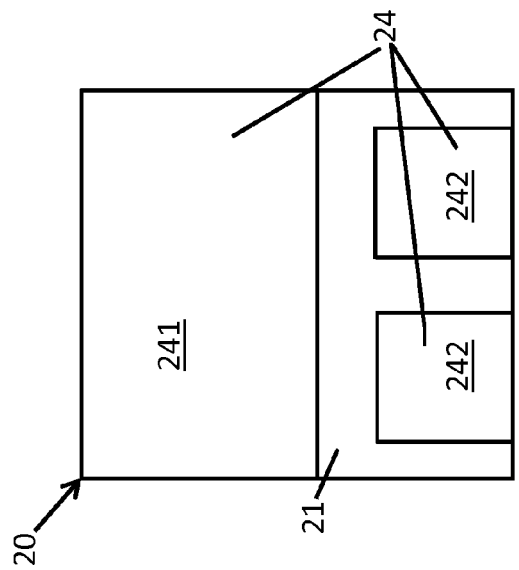
FIG. 1A is a side view of surface mount ceramic device in accordance with embodiments.

As will be described below, an interposer is provided with a stress-reduction mechanism and design. The interposer can be made of various materials, such as ceramic, HiCTE ceramic, SiC, etc., with a thickness as low as 0.01 inch, has a footprint that is generally similar to that of a surface mount device (SMD) and has cavities formed therein. The cavities are shaped and positioned to correspond to SMD terminal pads and are filled with a compliant material, such as a high lead content solder (e.g., 90Pb/10Sn solder) with a Young's modulus of approximately 2.0 msi (mega-pounds per square inch), which has a melting temperature that is much higher than that of a less compliant eutectic solder (e.g., 63Sn/37Pb solder) with a Young's modulus of approximately 4.5 msi. During assembly, the interposer is sandwiched between the SMD and a printed wiring board and top and bottom surfaces of the compliant, filled material in the cavities are soldered onto the SMD terminal pads and corresponding PWB soldering pads with eutectic solder. In another assembly process, the interposer, whose cavities are filled with the compliant material, is soldered onto the SMD terminal pads with the same compliant material with the other side of the interposer subsequently soldered onto the PWB soldering pads with eutectic solder. CTE mismatch induced load can then be substantially reduced through the compliant material filled in the cavities of the interposer to eliminate/minimize risks of substrate cracking in the SMD.

With reference now to FIGS. 1A-5B, an electronic apparatus 10 is provided and includes a first electronic device 20, a second electronic device 30, first solder material 40 proximate to the first electronic device 20, second solder material 50 proximate to the second electronic device 30 and an adaptive interposer 60. As shown in FIGS. 3A-5B, the adaptive interposer includes at least one plate element 70 formed to define at least one cavity 71 and third solder material 72 (see FIGS. 2A and 2B), which is disposable in each cavity 71 to be electrically communicative with the first and second solder materials 40 and 50.

Figure 3A:
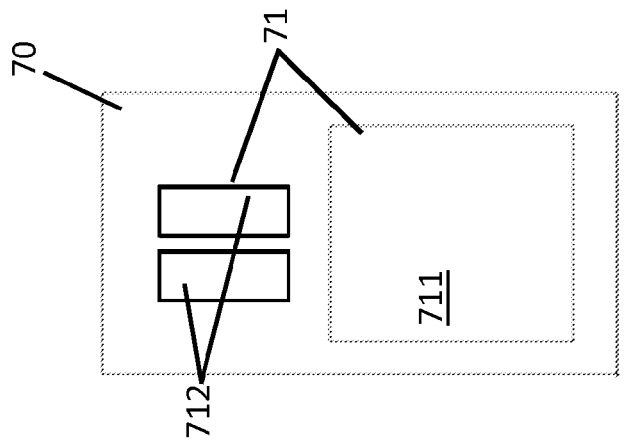
FIG. 3A is a plan view of the interposer of FIG. 2 in accordance with embodiments.
Figure 3B:
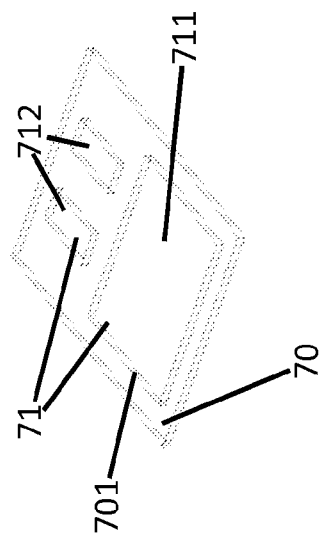
FIG. 3B is a perspective view of the interposer of FIG. 3A.
Figure 4A:
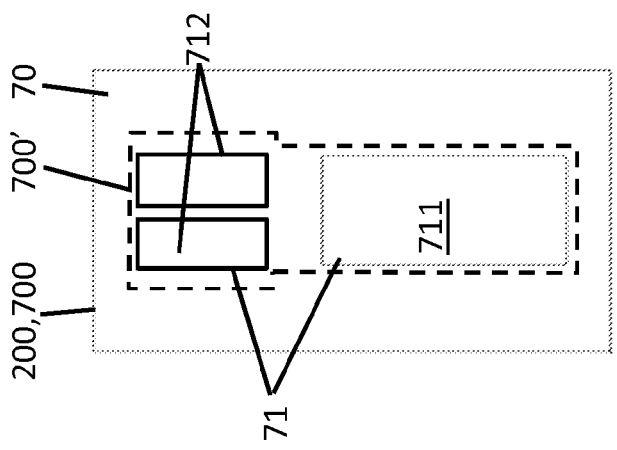
FIG. 4A is a plan view of the interposer of FIG. 2 in accordance with alternative embodiments.
Figure 4B:
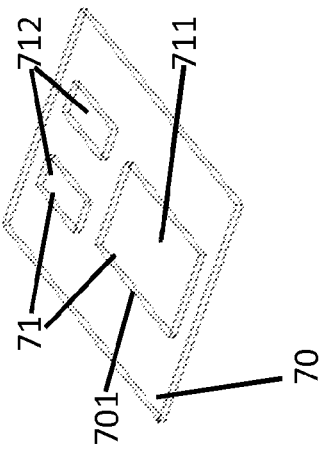
FIG. 4B is a perspective view of the interposer of FIG. 4A.
Figure 5A:
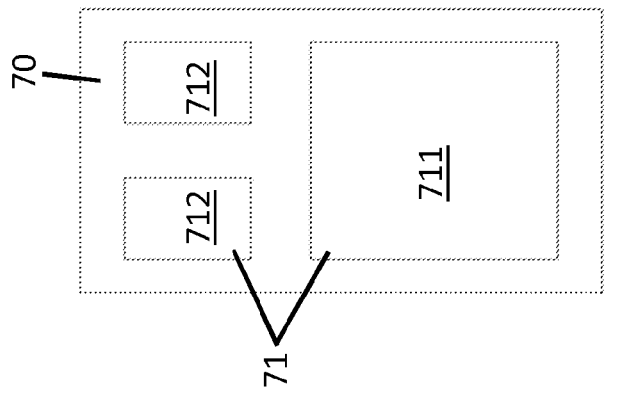
FIG. 5A is a plan view of the interposer of FIG. 2 in accordance with alternative embodiments.
Figure 5B:
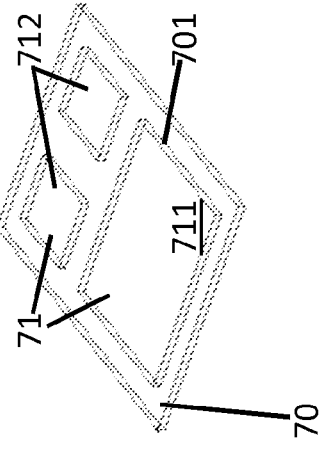
FIG. 5B is a perspective view of the interposer of FIG. 5A.

In accordance with embodiments, the at least one plate element 70 may be formed of various materials, such as ceramic, HiCTE ceramic, SiC, etc. In addition, as shown in FIGS. 3B, 4B and 5B, sidewalls 701 of the at least one cavity 71 may be plated with a metallic material, such as copper or an alloy thereof. The third solder material 72 is more compliant than either of the first and second solder materials 40 and 50. In addition, the third solder material 72 has a higher melting temperature than either of the first and second solder materials 40 and 50.

Figure 1B:
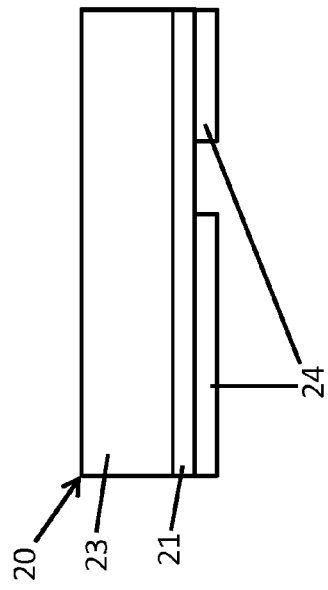
FIG. 1B is a plan view of an underside of the surface mount ceramic device of FIG. 1A in accordance with embodiments.
Figure 2A:
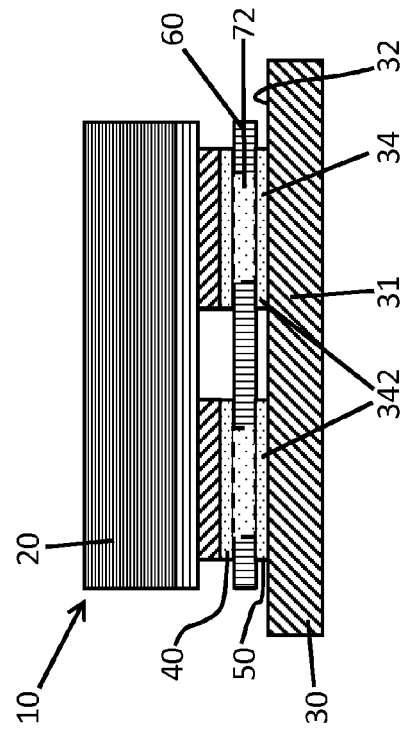
FIG. 2A is a front-side view of an electronic apparatus including the surface mount ceramic device of FIGS. 1A and 1B, a printed wiring board and an interposer.
Figure 2B:
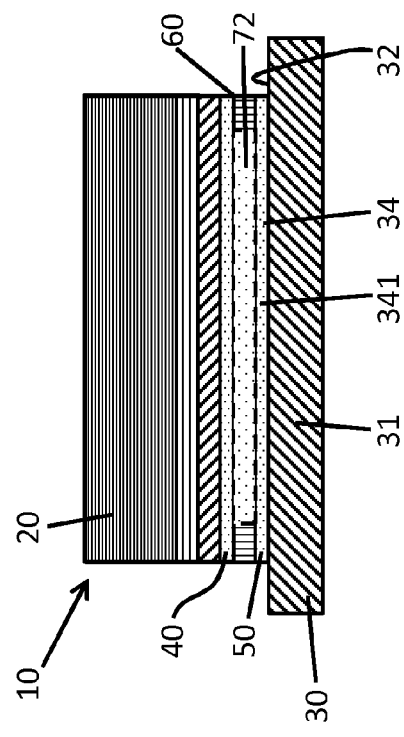
FIG. 2B is a rear-side view of the electronic apparatus including the surface mount ceramic device of FIGS. 1A and 1B, the printed wiring board and the interposer.

The first electronic device 20 may be provided as a surface mount ceramic device (SMD.5 or, more generally, SMD) and includes an alumina substrate 21, a Kovar™ housing and lid 23 and first terminal pads 24 formed of tungsten, copper or some other suitable material. In accordance with embodiments and, as shown in FIG. 1B, the first terminal pads 24 may be provided as a group of one large terminal pad 241, which occupies an area at one longitudinal side of the first electronic device 20, and two small terminal pads 242, which are displaced from each other and the large terminal pad 241 at the other longitudinal side of the first electronic device 20.

The second electronic device 30 may be provided as a printed wiring board (PWB) having a body 31 and a surface 32. Second terminal pads 34 may be disposed on the surface 32 and circuitry may be provided in the body 31 and/or on the surface 32 to permit electrical communication to and from the second terminal pads 34. The second terminal pads 34 may be arranged in a similar fashion as the first terminal pads 24. That is, in accordance with embodiments, the second terminal pads 34 may be provided as a group of one large terminal pad 341 (see FIG. 2A), which corresponds in shape, size and position to the large terminal pad 241, and two small terminal pads 342 (see FIG. 2B), which similarly correspond in shape, size and position to the two small terminal pads 242.

At least one or more of the various components of the second electronic device 30 may be formed of materials different from those of the first electronic device 20. As such, the first and second electronic devices 20 and 30 will tend to have different respective coefficients of thermal expansion (CTEs) and thus will thermal expand and contract at differing rates and by differing degrees during thermal cycling associated with various assembly processes.

Although respective arrangements of the first and second terminal pads 24 and 34 are described above, it will be understood that other respective arrangements may be provided for each of the first and second terminal pads 24 and 34. It will be further understood that these other respective arrangements can be similar to one another or different from one another. In any case, for purposes of clarity and brevity, it will be assumed that the first and second terminal pads assume the respective arrangements described above and that the following description relates to that exemplary case. That is, with additional reference to FIGS. 3A-5B, the adaptive interposer 60 may be formed as a single plate element 70 with a large cavity 711, which corresponds in shape, size and position to the large terminal pads 241, 341, and small cavities 712, which respectively correspond in shape, size and position to the small terminal pads 242, 342.

The first solder materials 40 are disposable proximate to the first terminal pads 24. The second solder materials 50 are disposable proximate to the second terminal pads 34. In accordance with embodiments, the first and second solder materials 40 and 50 may be formed of similar materials, such as eutectic solder with a Young's modulus of approximately 4.5 msi or, more particularly, 63Sn/37Pb solder. Alternatively, the first and second solder materials 40 and 50 may be formed of different materials, such as where the first solder materials 40 include at least one of eutectic solder or 63Sn/37PB solder and high lead content solder with a Young's modulus of approximately 2.0 msi or, more particularly, 90Pb/10Sn solder and the second solder materials 50 include eutectic solder or 63Sn/37PB solder.

In any case, the characteristic compliance and melting temperature of the first and second solder materials 40 and 50 may be similar to those of 63Sn/37Pb solder. In conventional electronic device assemblies, in which the first solder materials 40 for each of the first terminal pads 24 would be directly coupled to the second solder materials 50 for each corresponding one of the second terminal pads 34, induced loads generated during thermal cycling derive from this direct coupling and the mismatched CTEs of the first and second electronic devices 20 and 30. Such induced loads are avoided in the embodiments described herein.

With the first and second electronic devices 20 and 30 configured as described above, the plate element 70 is disposable such that the large cavity 711 is between the first and second solder materials 40 and 50 that would otherwise be used to directly couple the large terminal pads 241, 341 and such that the small cavities 712 are respectively between the first and second solder materials 40 and 50 that would otherwise be used to directly couple the small terminal pads 242, 342. The third solder material 72 is thus disposable in each of the large cavity 711 and the small cavities 712 to be electrically communicative at a first side with the first solder materials 40 and at a second side with the second solder materials 50.

Figure 6:
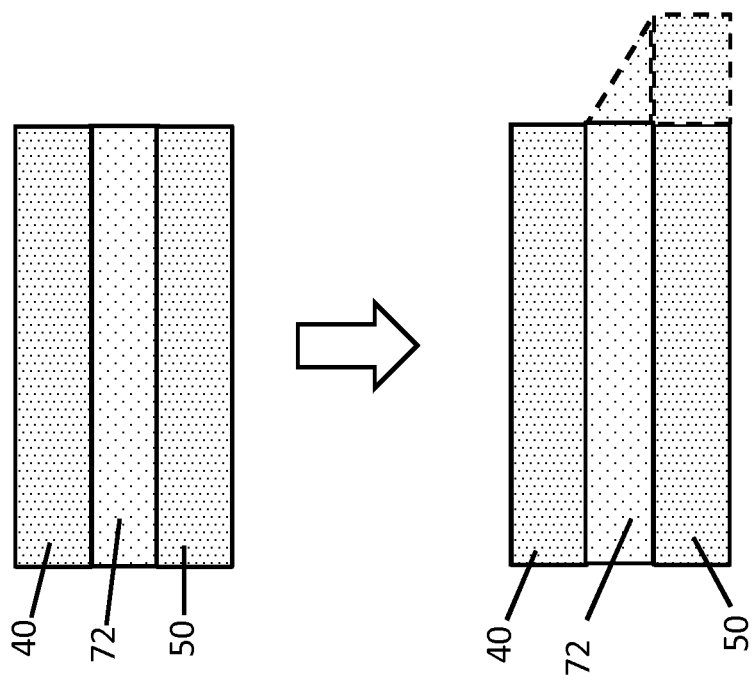
FIG. 6 is a side view illustrating compliance of a third solder material during thermal cycling.

With reference to FIG. 6, since the third solder material 72 is more compliant than at least the second solder materials 40 and may be more compliant than the first and second solder materials 40 and 50, the compliance of the third solder material 72 reduces the generation of induced loading of the electronic device 10. As shown in FIG. 6, the generation of the induced loading may result from the first and second solder materials 40 and 50 expanding or contracting at different rates during thermal cycling, which is illustrated in the dashed extension of the second solder materials 50.

In particular, during the thermal cycling associated with the soldering of the first and second solder materials 40 and 50 where the first and second electronic devices 20 and 30 may be exposed to temperatures ranging from about −55° C. or below to about 125° C. or above and thus expand and contract at differing rates and by differing degrees owing to their mismatched CTEs. In such cases, the compliance of the third solder material 72 allows the third solder material 72 to absorb thermal expansion and contraction of one of the first and second electronic devices 20 and 30 relative to the other. Moreover, since the third solder material 72 has a higher melting temperature than the first and second solder materials 40 and 50, the third solder material 72 remains in position and form during the solder processes of the first and second solder materials 40 and 50. In accordance with embodiments, the third solder material 72 may include a high lead content solder with a Young's modulus of approximately 2.0 msi or, more particularly, 90Pb/10Sn solder or some other similar materials.

In accordance with alternative embodiments, the first solder material 40 may be similar in composition to the third solder material 60. In such cases, the at least one plate element 70, whose cavities are filled with the third solder material 60, is soldered onto the first terminal pads 24 with the first solder material 40 which is essentially similar to the third solder material 60. The at least one plate element 70 may then be subsequently soldered onto the second terminal pads 34 with the second solder material 50.

The at least one plate element 70 serves multiple functionalities including, but not limited to, preventing reflow of the third solder material 72, permitting heat transfer between the first and second electronic devices 30 and 40 and preventing short circuits. Each such functionality can be accomplished by way of the at least one plate element 70 even while the at least one plate element 70 has a footprint 700, which may be similarly sized and shaped or possessed of a lesser size and shape as a footprint 200 of the first electronic device 20 on the second electronic device 30 (see, e.g., FIG. 4A). That is, in accordance with some embodiments, where the first electronic device 20 has a rectangular shaped footprint 200 and a certain size, the at least one plate element 70 may have a rectangular shaped footprint 700 with substantially the certain size. Conversely, in accordance with alternative embodiments, where the first electronic device 20 has a rectangular shaped footprint 200 and a certain size, the at least one plate element 70 may have an irregularly shaped footprint 700' that largely follows the footprint of the terminal pads 24.

In any case, the at least one plate element 70 may be formed to define the cavities 71 (i.e., the large cavity 711 and the small cavities 712) to have respective areas spanning about 45-90% of respective areas of the first and second terminal pads 24 and 34. That is, as shown in FIGS. 3A and 3B, the large cavity 711 may have an area that spans about 90% of the respective areas of the large terminal pads 241 and 341 and the small cavities 712 may have areas that span about 90% of the respective areas of the small terminal pads 242 and 342. By contrast, as shown in FIGS. 4A and 4B, the large cavity 711 may have an area that spans about 45% of the respective areas of the large terminal pads 241 and 341 and the small cavities 712 may have areas that span about 45% of the respective areas of the small terminal pads 242 and 342. Additionally, as shown in FIGS. 5A and 4B, the large cavity 711 may have an area that spans about 90% of the respective areas of the large terminal pads 241 and 341 and the small cavities 712 may have areas that span about 45% of the respective areas of the small terminal pads 242 and 342 (or vice versa). The gap between two small cavities 712 may, in some but not all cases, be the same as that between two small terminal pads 242 and 342. As a general matter, however, the inner edges of the various cavities 71 may overlap with outer edges of the terminal pads 24 and 34 so as to insure that the third solder material 72 remains in contact with the first and second solder materials 40 and 50.

Figure 7:
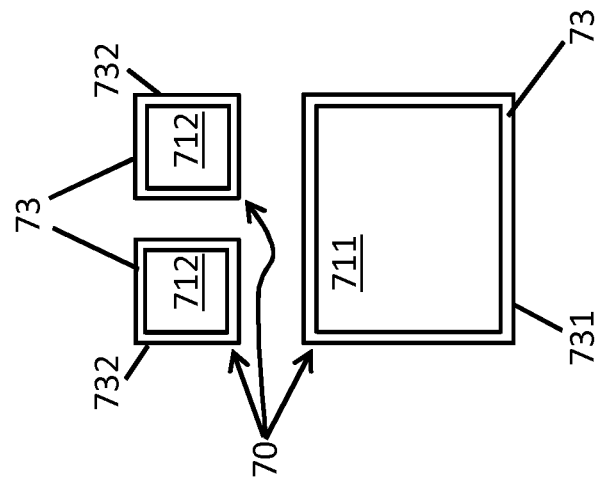
FIG. 7 is a plan view of an interposer provided as a plurality of plate elements in accordance with alternative embodiments.

With reference to FIG. 7 and, in accordance with alternative embodiments, the at least one plate element 70 may be provided as multiple plate elements 73. In such cases and for the terminal pad embodiments described above, the multiple plate elements 73 would include a large plate element 731 formed to define the large cavity 711 (of about 45-90% large terminal pad area) and small plate elements 732 formed to define the small cavities 712 (of about 45-90% small terminal pad area).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

While the embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. An adaptive interposer operably disposable between first and second solder materials of first and second electronic devices, respectively, the adaptive interposer comprising:
    a plate element formed to define cavities; and
    third solder material disposable in the cavities to be electrically communicative with the first and second solder materials;
    the third solder material being more compliant and having a higher melting temperature than at least the second solder materials, an uppermost plane of the third solder material and a lowermost plane of the first solder materials being flush with an uppermost plane of the plate element, and a lowermost plane of the third solder material and an uppermost plane of the second solder materials being flush with a lowermost plane of the plate element.

2. The adaptive interposer according to claim 1, wherein the plate element comprises:
ceramic materials; and
metallic plating on cavity walls.

3. The adaptive interposer according to claim 1, wherein the plate element has a footprint of similar or lesser size than a footprint of the first electronic device and is formed to define cavities of varying sizes.

4. The adaptive interposer according to claim 1, wherein the first solder materials comprise one of eutectic solder and high lead content solder, the second solder materials comprise eutectic solder and the third solder material comprises high lead content solder.

5. The adaptive interposer according to claim 1, wherein the first solder materials comprise one of 63Sn/37Pb solder and 90Pb/10Sn solder, the second solder materials comprise 63 Sn/37Pb solder and the third solder material comprises 90Pb/10Sn solder.

6. An adaptive interposer assembly operably disposable between first and second electronic devices, the adaptive interposer assembly comprising:
first and second solder materials disposable proximate to terminal pads of the first and second electronic devices, respectively;
a plate element formed to define cavities configured to correspond in position to respective locations of the terminal pads of the first and second electronic devices; and
third solder material disposable in the cavities between the first and second solder materials to be electrically communicative with the first and second solder materials;
the third solder material being more compliant and having a higher melting temperature than at least the second solder materials,
an uppermost plane of the third solder material and a lowermost plane of the first solder materials being flush with an uppermost plane of the plate element, and
a lowermost plane of the third solder material and an uppermost plane of the second solder materials being flush with a lowermost plane of the plate element.

7. The adaptive interposer assembly according to claim 6, wherein the plate element comprises:
ceramic materials; and
metallic plating on cavity walls.

8. The adaptive interposer assembly according to claim 6, wherein the plate element has a footprint of similar or lesser size than a footprint of the first electronic device and is formed to define cavities of varying sizes.

9. The adaptive interposer assembly according to claim 8, wherein the terminal pads of each of the first and second electronic devices respectively comprise terminal pads of varying sizes.

10. The adaptive interposer assembly according to claim 9, wherein the cavities of varying sizes have respective areas spanning about 45-90% of respective areas of the terminal pads of varying sizes.

11. The adaptive interposer according to claim 6, wherein the first solder materials comprise one of eutectic solder and high lead content solder, the second solder materials comprise eutectic solder and the third solder material comprises high lead content solder.

12. The adaptive interposer assembly according to claim 6, wherein the first solder materials comprise one of 63Sn/37Pb solder and 90Pb/10Sn solder, the second solder materials comprise 63Sn/37Pb solder and the third solder material comprises 90Pb/10Sn solder.

13. An electronic apparatus, comprising:
a first electronic device comprising first terminal pads;
a second electronic device comprising second terminal pads;
first and second solder materials disposable proximate to the first and second terminal pads, respectively;
at least one plate element formed to define at least one cavity configured to correspond in position to a respective location of a corresponding one of each of the first and second terminal pads; and
third solder material disposable in each cavity between the first and second solder materials to be electrically communicative with the first and second solder materials;
the third solder material being more compliant and having a higher melting temperature than at least the second solder materials,
an uppermost plane of the third solder material and a lowermost plane of the first solder materials being flush with an uppermost plane of the plate element, and
a lowermost plane of the third solder material and an uppermost plane of the second solder materials being flush with a lowermost plane of the plate element.

14. The electronic apparatus according to claim 13, wherein the at least one plate element comprises:
ceramic materials; and
metallic plating on cavity walls.

15. The electronic apparatus according to claim 13, wherein the first electronic device comprises a surface mount device (SMD) and the second electronic device comprises a printed wiring board (PWB), the at least one plate element has a footprint of similar or lesser size than a footprint of the SMD on the PWB and wherein:
the first terminal pads comprise first terminal pads of varying sizes, and
the second terminal pads comprise second terminal pads of varying sizes.

16. The electronic apparatus according to claim 15, wherein the at least one plate element is formed to define cavities of varying sizes having respective areas spanning about 45-90% of respective areas of the first and second terminal pads of varying sizes.

17. The electronic apparatus according to claim 15, wherein the at least one plate element comprises multiple plate elements respectively formed to define cavities of varying sizes having respective areas spanning about 45-90% of respective areas of the first and second terminal pads of varying sizes.

18. The electronic apparatus according to claim 15, wherein the at least one plate element is formed to define two small cavities and one large cavity and wherein a gap between the two small cavities is a same as that between two small ones of each of the first and second terminal pads.

19. The electronic apparatus according to claim 13, wherein the first solder materials comprise one of eutectic solder and high lead content solder, the second solder materials comprise eutectic solder and the third solder material comprises high lead content solder.

20. The electronic apparatus according to claim 13, wherein the first solder materials comprise one of 63Sn/37Pb solder and 90Pb/10Sn solder, the second solder materials comprise 63Sn/37Pb solder and the third solder material comprises 90Pb/10Sn solder.

* * * * *